(12) United States Patent
Schmidt et al.

(10) Patent No.: US 10,475,689 B2
(45) Date of Patent: Nov. 12, 2019

(54) METHOD FOR PROCESSING A HOLDING PLATE, IN PARTICULAR FOR A CLAMP FOR HOLDING A WAFER

(71) Applicant: Berliner Glas KGaA Herbert Kubatz GmbH & Co., Berlin (DE)

(72) Inventors: Volker Schmidt, Berlin (DE); Ralf Hammer, Freiberg (DE); Gregor Hasper, Berlin (DE); Mike Fischer, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 0 days.

(21) Appl. No.: 15/873,454

(22) Filed: Jan. 17, 2018

(65) Prior Publication Data

US 2018/0211861 A1 Jul. 26, 2018

(30) Foreign Application Priority Data

Jan. 20, 2017 (DE) .................. 10 2017 000 528

(51) Int. Cl.
*C23C 16/32* (2006.01)
*C23C 16/48* (2006.01)
(Continued)

(52) U.S. Cl.
CPC ...... *H01L 21/6833* (2013.01); *C23C 16/0209* (2013.01); *C23C 16/047* (2013.01);
(Continued)

(58) Field of Classification Search
CPC ..... C23C 16/325; C23C 16/32; C23C 16/483; C23C 14/0635
See application file for complete search history.

(56) References Cited

U.S. PATENT DOCUMENTS 5,072,806 A * 12/1991 Odajima .................. H04R 7/02
181/170
5,437,757 A * 8/1995 Rice .................. H01L 21/68721
118/728

(Continued)

FOREIGN PATENT DOCUMENTS

DE 102015007216 A1 12/2016
EP 0908932 * 4/1999 ............. H01L 21/00

(Continued)

OTHER PUBLICATIONS

Kimock, Fred, et al., "CVD SiC is the Optimal Material for Semiconductor Equipment Components". Chip Design, Jun. 2008, pp. 21-23.*
Engineer Live announcement "Pure CVD silicon carbide wafer carriers". pp. 1-2, Feb. 21, 2013.*
Search Report from UKIPO dated Jul. 5, 2018.

(Continued)

*Primary Examiner* — Bret P Chen
(74) *Attorney, Agent, or Firm* — Caesar Rivise, PC

(57) ABSTRACT

A method for processing a holding plate (10) of a clamping device (in particular clamp wafer chuck) for holding a component, in particular a wafer, wherein the holding plate (10) has a SiC-based surface (12) on which at least one protruding, SiC-based surface element (13) is formed, includes the steps of locally limited heating of the holding plate (10) in a predetermined surface section and creating the surface element (13) at the predetermined surface section by chemical vapor deposition, in particular by means of laser CVD. Applications of the method exist in repairing a holding plate (10) of a clamping device or manufacturing a holding plate (10) of a clamping device. Furthermore, a holding plate of a clamping device for holding a component, in particular a wafer, is described.

12 Claims, 2 Drawing Sheets

(51) Int. Cl.
*H01L 21/683* (2006.01)
*C23C 16/56* (2006.01)
*C23C 16/02* (2006.01)
*C23C 16/04* (2006.01)

(52) U.S. Cl.
CPC .......... *C23C 16/325* (2013.01); *C23C 16/483* (2013.01); *C23C 16/56* (2013.01); *H01L 21/6838* (2013.01)

(56) References Cited

U.S. PATENT DOCUMENTS

| | | | | |
|---|---|---|---|---|
| 6,135,054 | A * | 10/2000 | Inoue | C23C 16/325 118/715 |
| 6,258,228 | B1 * | 7/2001 | Reiss | H01L 21/68721 118/503 |
| 6,475,068 | B1 * | 11/2002 | Jimbo | B24B 7/228 451/285 |
| 6,506,254 | B1 * | 1/2003 | Bosch | C23C 16/4404 118/715 |
| 2004/0266181 | A1 * | 12/2004 | Schauer | C23C 16/4581 438/680 |
| 2006/0046345 | A1 * | 3/2006 | Akram | G01R 3/00 438/105 |
| 2008/0247114 | A1 * | 10/2008 | Yeo | H05F 3/04 361/220 |
| 2009/0284894 | A1 | 11/2009 | Cooke | |
| 2011/0299218 | A1 * | 12/2011 | Lee | H01L 21/6831 361/234 |
| 2015/0017335 | A1 * | 1/2015 | Werner | C09D 183/16 427/385.5 |
| 2015/0228841 | A1 * | 8/2015 | Murakami | H01L 31/022425 438/72 |
| 2015/0298216 | A1 * | 10/2015 | Macario | B23B 29/26 82/153 |
| 2016/0354864 | A1 * | 12/2016 | Hammer | B23K 26/352 |
| 2018/0190534 | A1 * | 7/2018 | Poiesz | G03F 7/707 |

FOREIGN PATENT DOCUMENTS

| | | | |
|---|---|---|---|
| KR | 20100138188 A | 12/2010 | |
| WO | WO 91/20098 | * 12/1991 | ............ H01L 29/24 |

OTHER PUBLICATIONS

English language abstract of DE 102015007216 A1 (2016).
Mi, J. (2006). SiC Growth by Laser CVD and Process Analysis (Doctoral dissertation, Georgia Institute of Technology). pp. i-258.
Allen, S. D. (1981). Laser chemical vapor deposition: A technique for selective area deposition. Journal of Applied Physics, 52(11), 6501-6505.
Bondi et al. (2006). Laser assisted chemical vapor deposition synthesis of carbon nanotubes and their characterization. Carbon, 44(8), 1393-1403.
Ebert et al. (2006). Lasermikrosintern von Keramik. Laserinstitut der Hochschule Mittweida. Hochschule Mittweida University of Applied Sciences. p. 1-2.
Exner et al. (2003). Laserstrahllöten von Siliziumkarbidkeramik für Hochtemperaturanwendungen. Laserinstitut der Hochschule Mittweida. Hochschule Mittweida University of Applied Sciences. p. 1.
Exner et al. (1999). Laser welding of functional and constructional ceramics for Microelectronics. In Laser Applications in Microelectronic and Optoelectronic Manufacturing IV (vol. 3618, pp. 262-269). International Society for Optics and Photonics.
Hopfe et al. (1995). Laser CVD vs. hot wall CVD: coating of fibres for ceramic composites. Le Journal de Physique II, 5(C5), C5-647-C5-654.
Kruth et al. (2008). Roughness improvement in selective laser melting. In Proceedings of the 3rd international conference on polymers and moulds innovations (p. 170-183).
Liu et al. (2008). Pulsed laser CVD investigations of single-wall carbon nanotube growth dynamics. Applied Physics A, 93(4), 987-993.
Mi et al. (2003). Silicon carbide growth using laser chemical vapor deposition. Rapid Prototyping and Manufacturing Institute. Woodruff School of Mechanical Engineering. Georgia Institute of Technology. p. 510-523.
Reisse et al. (1996). Titanium nitride thin film deposition by laser CVD. Applied Surface Science, 106, 268-274.
Williams, K. L. (2006). Laser-assisted CVD fabrication and characterization of carbon and tungsten microhelices for microthrusters (Doctoral dissertation, Acta Universitatis Upsaliensis). Digital Comprehensive Summaries of Uppsala Dissertations from the Faculty of Science and Technology 151. p. 1-39.

* cited by examiner

METHOD FOR PROCESSING A HOLDING PLATE, IN PARTICULAR FOR A CLAMP FOR HOLDING A WAFER

BACKGROUND OF THE INVENTION

The invention relates to a method of processing, in particular manufacturing and/or repairing, a holding plate, which has a SiC-based surface and is provided for a clamping device (clamp, wafer chuck) for holding a component by electrostatic forces or low-pressure. In particular, the invention relates to a method of processing a holding plate, which is adapted for supporting a semiconductor component, e. g. a wafer, with electrostatic forces or by means of low-pressure, and which is provided with a structured surface with SiC-based surface elements (protrusions, e. g. protruding burls). The invention also relates to a method of manufacturing a clamping device being provided with the holding plate. The invention also relates to a holding plate with a structured, SiC-based surface with surface elements being arranged to hold a component, and to a clamping device with such a holding plate, in particular an electrostatic clamp or a vacuum clamp. Applications of the invention are e. g. in the manufacturing of tools, machines or wafers for the semiconductor industry.

It is generally known that integrated circuits (semiconductor chips) are produced by lithographic processing of semiconductor wafers which are held by a clamping device with electrostatic forces (electrostatic clamp) or by means of low-pressure (vacuum clamp). Further applications of clamping devices exist in inspection or measurement methods wherein, for example, the planarity of a wafer is determined. The clamping device comprises one or two holding plates with exposed surfaces for accommodating semiconductor wafers, as well as electrode devices, cooling devices and, if necessary, further electrical, mechanical or pneumatic components. With increasing integration density during chip production, extremely high demands are made on the planarity of the semiconductor wafers, for example in exposure steps, which must be ensured by the mechanical stability and the planarity of the surface(s) of the holding plate(s).

Since semiconductor wafers can be deformed in a disturbing manner even by dust particles on the surface of the holding plate, the holding plate is typically provided with a large number of protrusions, the free end sides (front faces) of which span a plane carrier surface. The projections comprise, for example, so-called burls. The burls have the advantage that the contact surface between the holding plate and the semiconductor wafer is minimized and eventually occurring dust particles can be collected in spaces between the burls. Furthermore, holding plates are typically made of a ceramic material, since ceramic materials are available with particularly high mechanical stability and strength.

In manufacturing a conventional clamping device, firstly the holding plate is made from the ceramic material with a free, flat surface. The burls are then formed by a material removal from the ceramic material. Various ablation methods are known for this purpose, such as cutting processes using a CNC milling machine, removal by means of die-sinking or removal by means of laser ablation (DE 10 2015 007 216 A1).

The conventional methods are characterized by the following disadvantages, especially in the production of burls with small diameters (e. g. 500 μm or smaller). Firstly, a relatively large amount of material has to be removed to provide the free-standing burls, which is time-consuming and energy-intensive. Undesired ceramic particles can occur in particular during machined processing and die-sinking and damage to the ceramic material can occur. Secondly, small processing errors, for example due to the omission of some burls during production, already can lead to the non-usability of the holding plate. In many practical applications of clamping devices in semiconductor processing, a vanishing error rate is required. Thirdly, processing errors or later damage to the holding plate cannot be corrected. With conventional techniques, it is not possible to restore an inadvertently damaged, e. g. broken off protrusion.

The above-mentioned problems of manufacturing holding plates occur not only with holding plates for wafer clamps with protruding burls, but also with holding plates for other tasks in which surface elements with more complicated shapes are formed.

Under the title "Silicone Carbide Growth using Laser Chemical Vapour Deposition", Jian Mi, Josh Gillespie, Ryan W. Johnson, Scott N. Bondi, and W. Jack Lackey proposed the deposition of SiC by means of laser-based chemical vapor deposition at the "Solid Freeform Fabrication Symposium" in Austin, Tex., USA, 2003. Due to their small dimensions of only about 10 μm and highly irregular geometries, however, the resulting structures had no practical applications.

OBJECTS OF THE INVENTION

The objective of the invention is to provide an improved method of processing a holding plate for the electrostatic holding or low-pressure holding of a component, avoiding disadvantages of conventional methods. The objective of the invention is, in particular, to manufacture the holding plate in such a way that protruding surface elements are formed with less time and energy expenditure and/or that the holding plate is manufactured with a reduced reject rate and/or that processing errors (or damages) can be corrected more easily. Furthermore, the objective of the invention is to provide an improved method of manufacturing a clamping device provided with the holding plate, wherein the method avoids disadvantages of conventional techniques. Furthermore, the objective of the invention is to provide an improved holding plate with protruding surface elements for electrostatic or low-pressure holding of a component and a clamping device provided with the holding plate, avoiding disadvantages of conventional techniques.

These objectives are solved by means of methods, a holding plate or a clamping device of the invention.

BRIEF SUMMARY OF THE INVENTION

According to a first general aspect of the invention, a method for processing a holding plate is provided, which is configured for a clamping device for holding a component, in particular a wafer. The holding plate has a SiC-based surface on which at least one protruding SiC-based surface element is formed. Preferably, a plate body of the holding plate is made of SiC, and particularly preferred the plate body consists of SiC or Si SiC (Si-infiltrated SiC). The processing of the holding plate preferably comprises manufacturing the at least one surface element on the surface of the plate body and/or repairing a holding plate (build-up or completion of missing surface elements) of a clamping device.

According to the invention, a locally limited heating of the holding plate in a predetermined surface section (deposition region) and the formation of the at least one surface element on the locally heated predetermined surface section by means of chemical vapor deposition (CVD) are carried out. In accordance with the invention, the at least one surface element is deposited from Si (silicon) and C (carbon) on the surface using the CVD process, whereby the restriction to the desired position of the at least one surface element takes place by the local heating of the holding plate, in particular the surface of the plate body, exclusively in the deposition region to a process temperature of the CVD deposition of Si and C, while in the surrounding of the respective surface section the process temperature of CVD deposition is not reached and therefore no deposition is effected. The process temperature of the chemical vapor deposition is preferably chosen in a range from 800° C. to 1400° C., especially in a range from 900° C. to 1100° C.

The inventor has found that surface elements of holding plates can surprisingly be produced with dimensions that are of practical interest and with sufficient mechanical stability for clamp applications. Advantageously, in accordance with the invention, a material build-up on the plate body takes place instead of a material removal from the plate body to form the at least one surface element. This saves energy and time, which is particularly important when creating a plurality of surface elements. If multiple surface elements are produced, they can be created sequentially or simultaneously in a common deposition process. In addition, the reject rate is drastically reduced by reworking or rebuilding defective surface elements.

Another important advantage of chemical vapor deposition is that the composition of the surface elements can be influenced by process parameters of the CVD deposition. In particular, the setting of the quantitative ratio of precursor substances (process gases), which cause the deposition of Si or SiC, makes it possible to adjust the Si content in the SiC. Advantageously, the composition of the surface elements thus can be adapted to the composition of the plate body and/or the surface of the surface elements can be formed in such a way that an enrichment of Si compared to the Si content in the volume material of the holding plate is given.

According to a second general aspect of the invention, a method for manufacturing a clamping device is provided which is configured to hold a component by electrostatic forces or low-pressure, wherein at least one holding plate of the clamping device is produced by the method according to the first general aspect of the invention. Furthermore, in order to create the clamping device, the at least one holding plate is connected to at least one of an electrode device, a cooling device, a vacuum device and further electrical components, mechanical components and pneumatic components.

According to a third general aspect of the invention, a holding plate is provided which is configured for a clamping device for holding a component, in particular a wafer, wherein the holding plate has an SiC-based surface on which a plurality of protruding SiC-based surface elements are formed. According to the invention, at least one of the surface elements of the holding plate has a grain microstructure being formed by chemical vapor deposition. Preferably, the holding plate is manufactured by the method according to the first general aspect of the invention. The inventive holding plate has the advantage of a high mechanical stability of the surface elements produced with the CVD process. The grain microstructure is characterized in particular by lower internal strains than the microstructure of sintered SiC or SiSiC. The inventor has found that the microstructure formed by the CVD process is surprisingly more stable than the volume material of the holding plate and can withstand the high stresses when using the clamping device to hold a component.

According to a fourth general aspect of the invention, a clamping device for holding a component by electrostatic forces or low-pressure is provided, which has at least one holding plate according to the third general aspect of the invention. The clamping device is an electrostatic clamping device or a vacuum clamping device for holding components, in particular semiconductor wafers.

Advantageously, various methods for local heating of the holding plate are available, such as e. g. local resistance heating or local energy input by means of electron irradiation. Preferably, however, the locally limited heating comprises a laser irradiation of the holding plate at the predetermined surface section. Advantageously, SiC-based surface elements can be produced using the laser-induced chemical vapor deposition method (laser CVD process, LCVD process). Irradiation parameters, in particular the power, of the laser irradiation are set in such a way that the process temperature of the vapor deposition of Si and C is exceeded at the irradiated surface sections. The application of the laser CVD method has the particular advantage that the deposition regions can be selected easily by directing the laser irradiation onto the surface of the holding plate. The laser CVD process is preferably carried out with a continuous wave laser (cw laser).

If multiple surface elements are created sequentially, the laser irradiation and local heating of the plate body takes place temporally consecutively at the desired surface sections at which the surface elements are to be built up. When the surface elements are simultaneously formed, the laser irradiation comprises a simultaneous pattern irradiation of the entire surface with an irradiation pattern corresponding to the desired surface sections at which the surface elements are to be built up, or a scanner irradiation in which, using a shutter in the beam path of the laser irradiation, the surface sections are irradiated sequentially at such a high speed that the process temperature is simultaneously set at these surface sections. The pattern irradiation or the scanner irradiation represents a positive image of the surface elements with an irradiation at the desired surface sections.

According to a preferred embodiment of the invention, process parameters of the chemical vapor deposition, in particular the precursor substances provided in a CVD reaction chamber in the gaseous or vaporous state, their concentration and pressure, are set in such a way that the surface element has an equal chemical composition like the surface of the holding plate, preferably like the plate body of the holding plate. The provision of this feature could be proven by the inventor by EDX measurements on holding plates manufactured according to the invention. Advantageously, this optimizes the adhesion of the surface elements to the holding plate.

Alternatively, the chemical composition and in particular the microstructure of the surface elements can be adjusted by selecting the process parameters of the chemical vapor deposition in such a way that they deviate from the chemical composition and microstructure of the volume material of the holding plate, in particular the plate body. For example, the plate body has a microstructure that is determined by sintering and infiltrating SiSiC. The surface elements can be deposited with a lower Si content compared to the plate body, so that a more compact microstructure of the surface elements results. This has an advantageous influence on the mechanical stability and durability of the surface elements and thus of the entire holding plate, in particular during the preferentially provided post-processing of the surface elements or the use of the holding plate in the clamp.

Advantageously, tempering of the holding plate up to a plate temperature below the process temperature of chemical vapor deposition can be provided. At the plate temperature, which is selected e. g. in the range from 500° C. to 800° C. and/or e. g. 100 to 400 degrees below the process temperature, no deposition takes place on the holding plate.

Advantageously, tempering allows the process temperature to be reached quickly, so that the overall process is accelerated and the power requirements of the laser CVD process radiation source are reduced. In addition, tempering prevents temperature gradients during local heating of the holding plate and thus avoids strains and damage to the volume material of the holding plate.

According to another preferred embodiment of the invention, the holding plate can be provided with at least one pre-structuring element at the position where the at least one surface element is to be formed. The pre-structuring element comprises a local recess or a local projection of the plate body of the holding plate. With this embodiment of the invention, the grain microstructure of the at least one surface element produced in accordance with the invention preferably projects into the holding plate, or the pre-structuring element of the holding plate protrudes into the grain microstructure of the surface element.

The at least one pre-structuring element can be produced, for example, by a mechanically ablative process or by laser ablation. Advantageously, the mechanical connection of the surface element to the holding plate is improved when the surface element is deposited on the pre-structuring element. The contact area between the surface element and the holding plate is increased compared to a flat surface of the holding plate and mechanical anchoring is achieved.

According to a particularly preferred embodiment of the invention, a post-processing of the at least one surface element is provided. The post-processing comprises a shaping and dimensioning of the surface element, whereby the height and/or thickness (cross-sectional dimension, e. g. diameter) of the completed surface element is adjusted by a material removal from the surface element (raw element) deposited by the CVD process. In addition, the post-processing comprises a healing of the surfaces of the surface elements, in particular with a removal of cracks or pores.

Preferably, the post-processing comprises material removal by means of pulsed laser irradiation and/or a mechanically effective ablation process (abrasive process, e. g. lapping, e. g. with a lapping wheel and a diamond suspension, grinding and/or polishing). Advantageously, post-processing allows the design of the at least one surface element in such a way that it has the shape and size desired for the respective application of the holding plate. In addition, mechanical properties of the surface element can also be adjusted by the shaping. If a plurality of surface elements is provided, the post-processing preferably comprises setting a common height. If all surface elements have the same height, they advantageously can span a plane supporting surface to hold the component. Particularly preferred, all surface elements can be provided with the same shape. Optionally, post-processing can comprise further steps such as the deposition of additional substances on the surface elements to form functional layers, such as e. g. electrically conductive layers and/or hardening layers.

Preferably, the post-processing of the at least one surface element includes laser processing. This can be carried out advantageously in the same process chamber as the LCVD process, whereby different radiation sources can be used for the LCVD process and with the post-processing. Particularly preferred is a laser processing with a first phase, in which laser parameters of the laser irradiation are adjusted in such a way that a laser ablation takes place, and with a second phase, in which laser parameters of the laser irradiation are adjusted in such a way that a healing of the surface of the surface element and its surrounding, in particular a sealing of pores or cracks, takes place. Advantageously, the surface of the surface elements or the entire holding plate can have an increased Si content in comparison to the volume material of the plate body as a result of post-processing (see DE 10 2015 007 216 A1). As with the creation of surface elements, laser processing can include a simultaneous pattern irradiation or a scanner irradiation of the surface. The pattern irradiation or the scanner irradiation represents a negative image of the completed surface elements with an irradiation of the areas between the surface elements.

Laser ablation has particular advantages in processing of the side slopes of the surface element and adjusting the thickness of the surface element. Laser ablation comprises a local, preferably focused pulsed irradiation, e. g. with a short pulse (ns)- or an ultrashort pulse (fs)-laser, so that an ablation temperature of e. g. 3000° C. is achieved. In a first step, the surface elements can be formed, preferably using a pulse laser with a pulse duration in the range of 2 ns to 500 ns. In a second step, the roundness and diameter of the surface elements are preferably set with a pulse laser having a pulse duration in the range from 100 fs to 500 fs.

Advantageously, the implementation of the invention is not limited to certain shapes of the surface element. This rather can be formed freely depending on the distribution of the locally limited process temperature setting (local heating in the surface section) and optional post-processing. The surface element preferably comprises the form of a burl (particularly cylindrical, conical or truncated pyramid-shape), a web or wall with a straight or curved shape along the surface of the holding plate. Different shapes of surface elements can be formed on a common holding plate.

The invention allows different material combinations. For example, the plate body of the holding plate can be made of SiC or SiSiC, and the at least one surface element can be made of SiC or SiSiC. The surface element preferably has a height of at least 5 µm and/or at most 500 µm, while the thickness of the surface element, e. g. the diameter of the burl or the thickness of a wall, is preferably at least 50 µm and/or at most 5000 µm.

BRIEF DESCRIPTION OF THE DRAWINGS

Further details and advantages of the invention are described below with reference to the enclosed drawings, which show in.

DETAILED DESCRIPTION OF PREFERRED EMBODIMENTS

Features of preferred embodiments of the invention are described in the following in particular with reference to the production of the holding plate with projections. Further steps in the production of the holding plate and the clamping device, such as the manufacturing of the plate body of the holding plate and/or the combination of the holding plate with further mechanical, electrical and/or pneumatic components, are not described as they are known as such from manufacturing of conventional clamping devices (clamps).

Reference is made to laser CVD as an example. The laser CVD process can be implemented, for example, as described by Jian Mi et al. (see above). However, the implementation of the invention is not restricted to laser CVD, but is possible with other CVD processes with locally limited heating of the plate body of the holding plate, e. g. with stripe or point-shaped resistance elements at the plate body or by local electron irradiation. Resistance heating can be particularly advantageous in the manufacturing of surface elements with extensions in the mm to cm range. Although the production of projections on only one surface of the holding plate is described, the production of projections on both surfaces of the holding plate can be provided alternatively.

Figure 1:
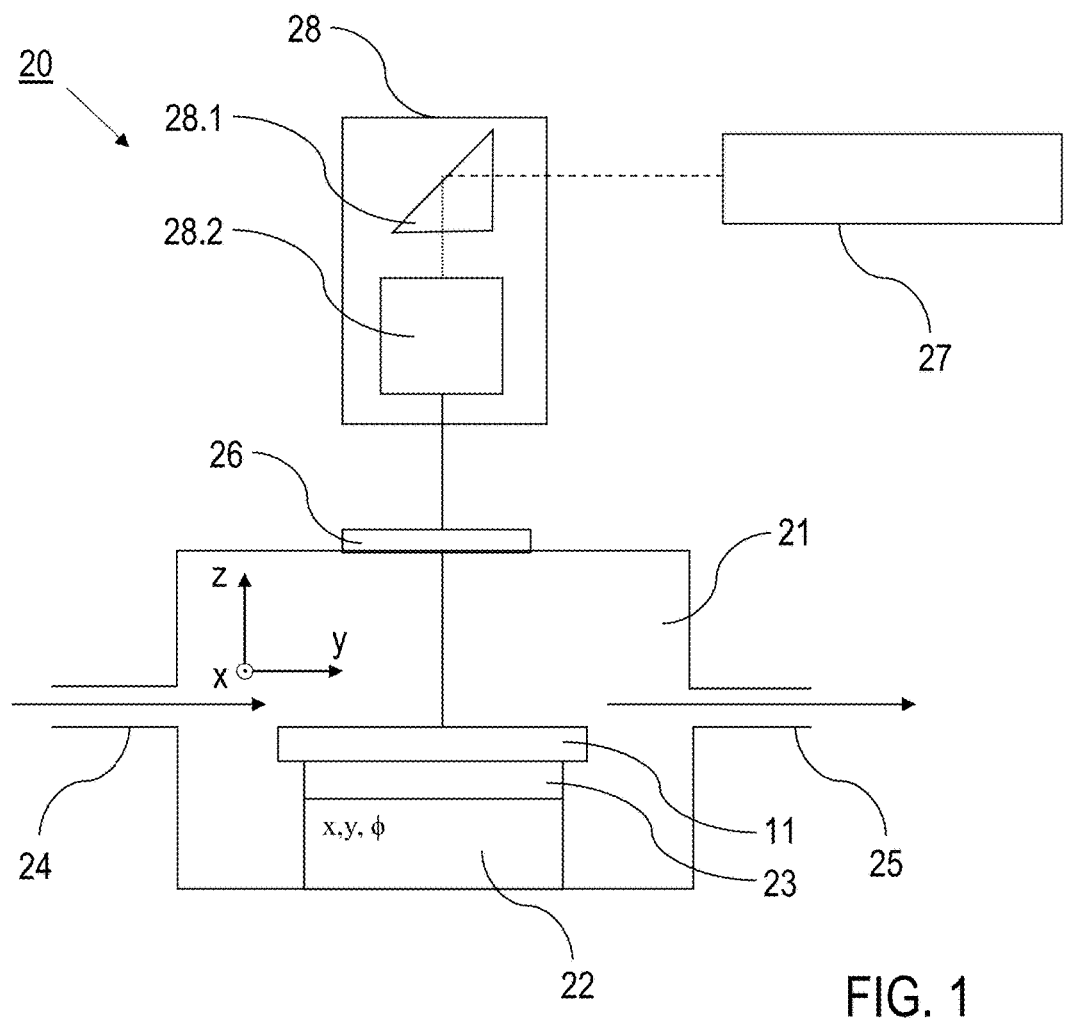
FIG. 1: a schematic illustration of a process chamber being adapted to carry out the method according to the invention.
Figure 2:
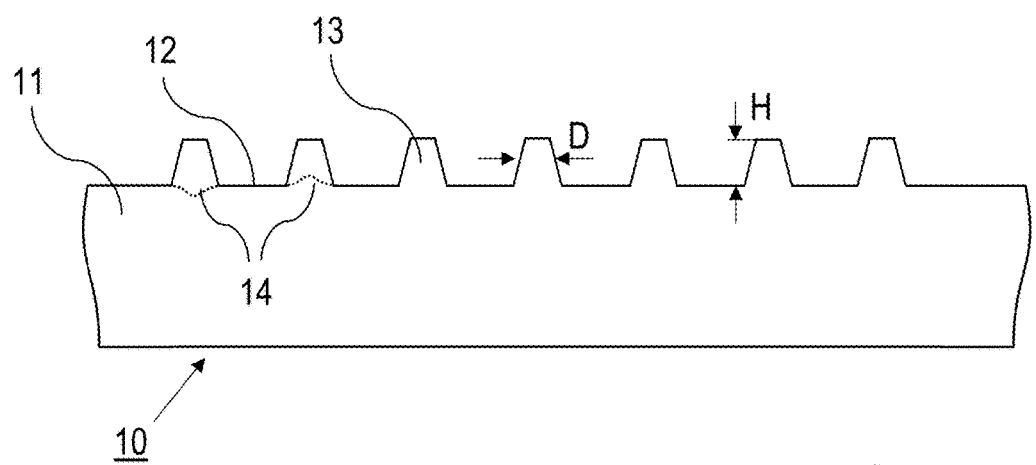
FIG. 2: a schematic sectional view of a holding plate according to an embodiment of the invention.
Figure 3:
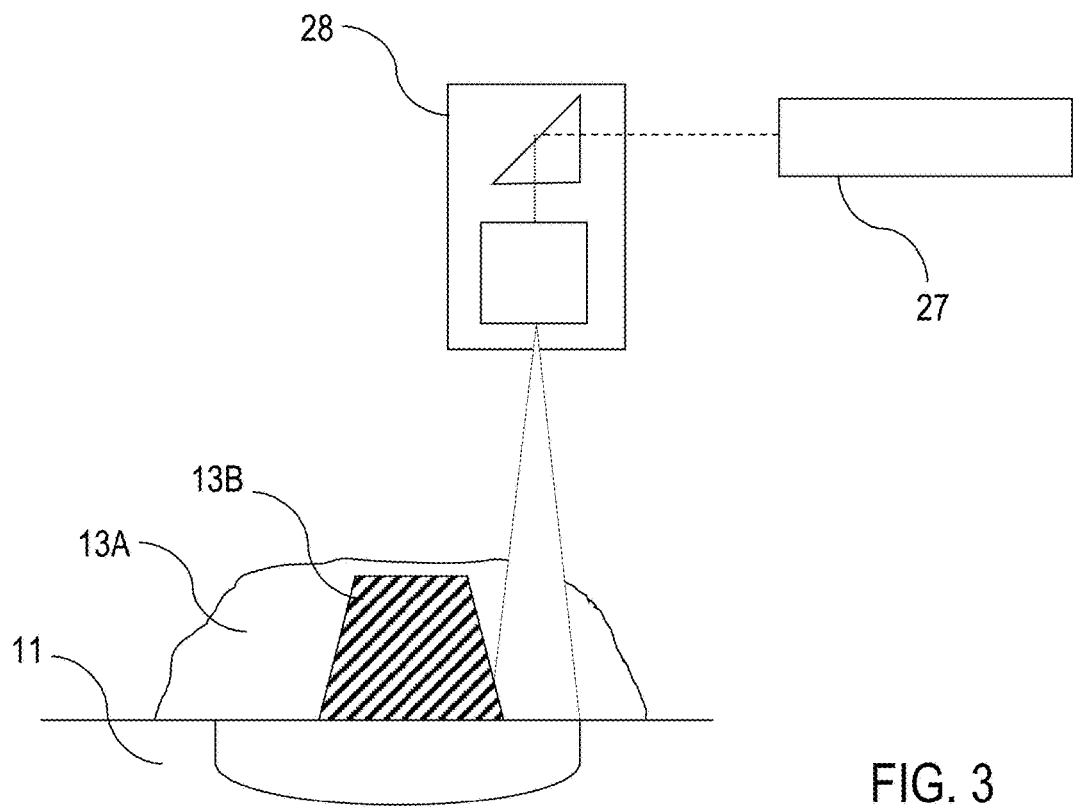
FIG. 3: a schematic illustration of the preferably provided post-processing of surface elements.
Figure 4:
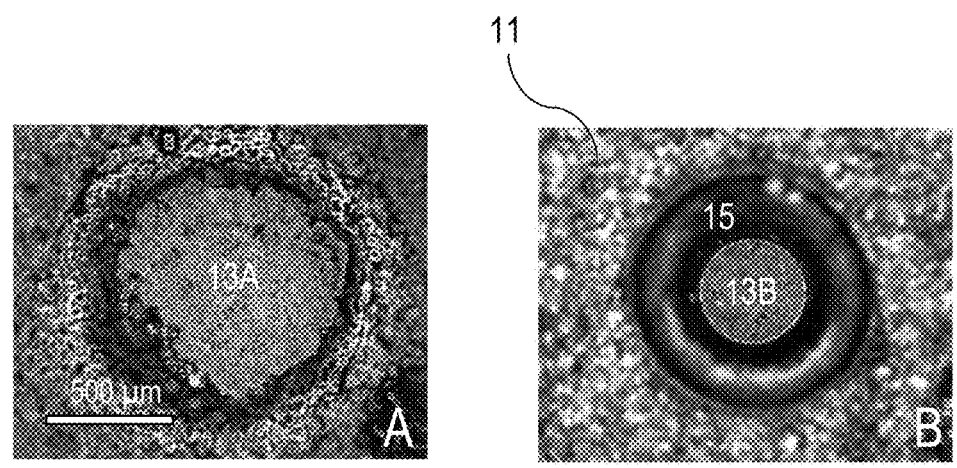
FIG. 4: electron microscopic images of burls produced by the inventive method, before and after post-processing.

FIG. 1 shows a schematic side-view of a laser CVD apparatus 20, which is provided for conducting the inventive method of processing a SiC holding plate. A schematic, enlarged sectional view of a holding plate 10 (partly shown), which is produced using the inventive method, is shown in FIG. 2. The preferred post-processing of surface elements 13 produced by the inventive method is illustrated in FIGS. 3 and 4.

In accordance with FIG. 1, the laser CVD apparatus 20 comprises a reaction chamber 21, in which an adjustable table 22 having a controllable temperature control element 23 (heating and/or cooling element) is arranged for accommodating the plate body 11 of the holding plate to be processed. The table 22 is adjustable in a horizontal plane (x-y plane) and can be rotated in this plane (angle φ in x-y plane). In addition, the reaction chamber 21 is provided in a manner known per se with at least one first line 24 for supplying of precursor substances, a second line 25 for discharging of residual gases and an optical window 26. Further details of the laser CVD apparatus 20, such as reservoirs for providing the precursor substances, monitoring devices, e. g. with a temperature sensor to detect the temperature of the plate body 11, control elements in the at least one first line 24, a collecting vessel for the residual gases and/or a control device of the laser CVD apparatus 20 are not shown in FIG. 1.

Outside the reaction chamber 21, a laser device 27 and irradiation optics 28, in particular with a deflection optic 28.1 and a beam shaping optic 28.2 are provided. The laser device 27 comprises, for example, a fiber laser (e. g. YLR series, manufacturer IPG Photonics) with an emission wavelength of 1064 nm, a Gaussian energy profile and a maximum output power of 100 W. The deflection optic 28.1 shown schematically can be adapted for a deflection of the laser light provided by the laser device 27 towards different surface sections on the plate body 11. The deflection optic 28.1 can, for example, comprise an adjustable prism or an adjustable mirror. The beam shaping optic 28.2 comprises, for example, optical lenses for focusing and/or beam shaping of the laser light on the surface of the plate body 11. The spot size of the laser irradiation on the surface of the plate body 11 is e.g. 30 μm.

According to a preferred variant of the invention, the deflecting optic 28.1 can be configured as a scanner head with a switchable shutter for a sequential, switchable irradiation of predetermined positions on the plate body 11 at such a high speed that the process temperature of the laser CVD process is simultaneously set at the irradiated sections and the surface elements grow simultaneously. For example, the irradiated surface section can move at a scanning speed of 100 mm/s over the surface of the plate body.

In order to carry out the LCVD process, the plate body 11 is positioned on the table 22 and tempered to a plate temperature of e. g. 600° C. FIG. 2 shows by way of example and as a schematic view that the plate body 11 can have pre-structuring elements 14 provided as local recesses or projections at the positions of the surface elements 14 to be deposited. The plate body 11 is positioned relative to the vertical light path of the laser light in such a way that, with the irradiation optic 28, the desired surface sections of the plate body 11 are reached by the laser irradiation. The laser CVD apparatus 20 is controlled in such a way that the process temperature of the CVD deposition of the surface elements is locally reached by laser irradiation during the supply of the precursor substances. During the production of the holding plate, e. g. 20 or more surface elements are built up on the surface of the plate body in one working step, one after the other or simultaneously by irradiating the corresponding surface sections. Correspondingly, multiple working steps can be provided for the production of the complete holding plate. With repairing of a holding plate, missing surface elements are rebuilt, for example, or surface elements worn out by use are supplemented. The latter includes, for example, the removal of one or more neighboring surface elements, e. g. by 20 μm, a local deposition of SiC or SiSiC and a new height adjustment together with the other surface elements to provide the flat carrier surface.

As a result of CVD deposition, the surface elements may have dimensions and shapes that differ from each other. If these differences are too large for the desired application of the invention and the surface elements are preferably produced with the same heights H and thicknesses D (e. g. mean diameter at half height of the burl) and with the same shapes, as schematically shown in FIG. 2, the post-processing of FIGS. 3 and 4 is provided.

The surface element 13A formed as a result of the CVD deposition is shown in FIG. 3 in schematic sectional view and in FIG. 4A in microscopic top view. The diameter of the surface element 13A is e. g. about 500 μm to 1 mm. By the post-processing, the diameter of the surface element 13A is reduced by laser ablation to the diameter of the finished surface element 13B to e. g. 450 μm. Subsequently, all surface elements get the same height, of e. g. 200 μm, by mechanical removal. FIG. 4B shows the completed surface element 13B (burl), in the surrounding of which, on the surface of the plate body 11, an annular recess 15 is visible in the plate body 11, which is formed as a result of the laser ablation.

The coating and the subsequent ablation and tempering processes can be carried out in a common apparatus in temporally consecutive order, whereby the same irradiation optic 28 is used, but for the post-processing optionally another laser device 27, such as a pulsed fiber laser, is used. After the coating (supply of precursor gases into the reaction chamber 21 and LCVD process), the reaction chamber 21 is ventilated or filled with a protective gas, e. g. N or Ar. Using the irradiation optic 28, a laser irradiation is then guided into the surrounding of the coated sections (FIG. 3). By ablation, the final shape of the burl is adjusted and the underlying areas are healed by tempering, i. e. existing cracks and pores are closed. This can be done in two phases, in which the laser parameters are set in in such a way that optimum conditions for ablation are given in the first phase and optimum conditions for healing or sealing of pores and cracks are given in the second phase. In ablation, for example, the laser irradiation power is 2 to 50 W, whereby in a first step of shaping a pulse laser with a pulse duration in the range from 2 to 500 ns is used and in a second step of edge rounding a pulse laser with a pulse duration in the range from 100 to 500 fs is used. In the second phase, a laser with an output power of laser irradiation in the range from 2 to 50 W and a pulse duration in the range 2 to 50 ns is used to heal and close cracks. By selecting the pulse duration from 2 to 50 ns at an average power of <30 W, the process is preferably set in such a way that, in combination with the ablation effect, a thermal reduction of stresses as well as the closure of cracks and pores with at least one phase of the material takes place.

Reference is made above in an exemplary manner to the formation of surface elements 13 having the shape of burls with a circular cross-section and a cylindrical, conical or truncated pyramid shape (see in particular FIGS. 2 and 4). The application of the invention is not limited to the formation of these special shapes, but is also suitable for the provision of other shapes and structures if a suitable pattern of irradiation of the laser CVD and/or adapted post-processing is selected. For example, surface elements with a cross-sectional shape in the form of an ellipse or a rectangle with rounded corners, or structures with a line-shaped cross-section, such as webs or walls with straight or curved wall surfaces, can be formed using the inventive application of laser CVD and optional post-processing laser ablation. Structures with a line-shaped cross-section are of interest e. g. in the formation of sealing structures ("seals") on clamp holding plates.

In order to form the surface elements with a certain shape, the two-dimensional beam cross-section of the laser irradiation can be adjusted by an adapted shaping. For example, with the beam shaping optic 28.2, the point-shaped laser exposure can be replaced by a two-dimensional shape, such as e. g. a line, a circle, a polygon, or a free-form, on the surface of the plate body 11. Thus, as an alternative to burls (1-dimensional exposure), line-shaped structural elements, e. g. seals, webs, or the like, can be generated e. g. on wafer chucks. Laser irradiation with a two-dimensionally shaped beam cross-section can be achieved, for example, by the use of aspherical optics, cylindrical lenses, scanners or arrays of laser diodes.

The features of the invention disclosed in the above description, drawings and claims may be of significance for the realization of the invention in its various forms, both individually or in combination or sub-combination.

What is claimed is:

1. A method for processing a holding plate of a clamping device for holding a component, wherein the holding plate has a SiC-based surface on which at least one protruding, SiC-based surface element is formed, comprising the steps of
    locally limited heating of the holding plate in a predetermined surface section,
    creating the at least one surface element at a predetermined surface section by chemical vapor deposition, and
    post-processing of the at least one surface element, wherein: (a) at least one of a height and a thickness of the at least one surface element is set; (b) the post-processing of the at least one surface element is conducted by laser irradiation; (c) in a first phase laser parameters of the laser irradiation are set in such a way that a laser ablation takes place; and (d) in a second phase laser parameters of the laser irradiation are set in such a way that a healing of the surface of the at least one surface element is carried out.

2. The method according to claim 1, wherein
    the locally limited heating is carried out by laser irradiation of the holding plate at the predetermined surface section, and
    the chemical vapor deposition comprises a laser CVD process.

3. The method according to claim 1, wherein process parameters of the chemical vapor deposition are set such that the at least one surface element has the same chemical composition as the surface of the holding plate.

4. The method according to claim 1, wherein process parameters of the chemical vapor deposition are set such that the at least one surface element has a lower Si content than the holding plate.

5. The method according to claim 1, further comprising the step of tempering the holding plate to a plate temperature below a process temperature of the chemical vapor deposition.

6. The method according to claim 1, wherein a pre-structuring element of the holding plate is provided at the predetermined surface section, comprising a local recess or a local projection of the holding plate.

7. The method according to claim 1, comprising at least one of the following features
    the holding plate consists of SiC or SiSiC,
    the at least one surface element comprises at least one of a burl, a web and a wall,
    the at least one surface element has a height of at least 5 µm and at most 5000 µm, and
    the at least one surface element has a thickness of at least 50 µm and at most 5000 µm.

8. The method according to claim 1, wherein a plurality of protruding surface elements are formed at a plurality of predetermined surface sections.

9. The method according to claim 1, wherein the clamping device is configured for holding a wafer.

10. The method according to claim 1, wherein a holding plate of a clamping device is repaired.

11. The method according to claim 1, wherein a holding plate of a clamping device is manufactured.

12. A method of manufacturing a clamping device for holding a component by electrostatic forces or vacuum, wherein at least one holding plate of the clamping device is manufactured by the method according to claim 1.

* * * * *